United States Patent [19]

Kennedy

[11] Patent Number: 5,140,700
[45] Date of Patent: Aug. 18, 1992

[54] FM RESONANT FILTER HAVING AM FREQUENCY BYPASS

[75] Inventor: John F. Kennedy, Garden City, Mich.

[73] Assignee: Ford Motor Company, Dearborn, Mich.

[21] Appl. No.: 624,428

[22] Filed: Dec. 7, 1990

[51] Int. Cl.⁵ .................................. H04B 11/16
[52] U.S. Cl. .................. 455/142; 455/188.1; 455/340
[58] Field of Search ........... 455/142, 144, 188–191, 455/339, 340, 193

[56] References Cited

U.S. PATENT DOCUMENTS

| | | | |
|---|---|---|---|
| 3,360,730 | 12/1967 | Sims | 455/142 |
| 4,157,547 | 6/1979 | Freimark et al. | 455/142 |
| 4,334,323 | 6/1982 | Moore . | |
| 4,406,019 | 9/1983 | Ide et al. | 455/339 |
| 4,736,457 | 4/1988 | Kupfer | 455/339 |
| 4,881,272 | 11/1989 | Eguchi | 455/188 |
| 4,972,353 | 11/1990 | Kennedy et al. | 455/193 |
| 5,020,145 | 5/1991 | Hong | 455/188 |
| 5,040,239 | 8/1991 | Kondo et al. | 455/193 |

FOREIGN PATENT DOCUMENTS 59-64930 4/1984 Japan .

Primary Examiner—Curtis Kuntz
Attorney, Agent, or Firm—Mark Mollon; Roger L. May

[57] ABSTRACT

A variable bandpass filter for filtering RF antenna signals to improve selectivity and reduce intermodulation distortion in an FM radio receiver includes a series resonant circuit which is modified to avoid blocking of AM signals. A bypass inductor is connected in parallel with the series resonant capacitor. The bypass inductor has a self-resonant frequency located between the AM and FM bands so that series resonant performance is maintained at FM frequencies and the bypassing function is exhibited at AM frequencies.

11 Claims, 2 Drawing Sheets

AM SIGNALS

FM RESONANT FILTER HAVING AM FREQUENCY BYPASS

BACKGROUND OF THE INVENTION

The present invention relates in general to radio receivers having a filtered RF input, and more specifically to AM/FM automotive radio receivers having an FM resonant input filter which conducts AM frequency signals substantially unattenuated.

Radio receivers must select a single broadcast from many strong and weak signals that may be present at the receiving antenna. The selectivity of a receiver refers to its ability to discriminate between a signal of interest and other signals at adjacent frequencies. This selectivity is typically achieved by bandpass filtering.

In a superheterodyne receiver, the radio-frequency (RF) signals are frequency shifted by mixing with an oscillator signal so that the RF signal of interest is shifted to an intermediate frequency (IF) which is typically lower than the RF frequency. A fixed IF filter is then used to reject signals at frequencies other than the IF frequencies so that filtering at the RF frequency stage is not necessary.

In order to improve sensitivity of a receiver, it is known to filter incoming signals at both the RF and the IF stages. The magnitude of signals of interest relative to other signals is increased. Furthermore, intermodulation distortion, which results from the mixing between signals not of interest into the frequency range containing the signal of interest, is reduced by providing RF filtering.

Resonant circuits typically provide the filtering used at RF frequencies. For example, a series resonant circuit located between an antenna and the input of a receiver can be provided having a controllable resonant frequency. A variable inductor connected in series with a capacitor are adapted to resonate throughout the FM frequency band. A tuning voltage generated in the receiver controls the resonant frequency of the series resonant filter to coincide with the signal of interest while attenuating other signals. This resonant circuit can be employed in combination with other series or parallel resonant circuits connected between the antenna and the receiver input or the receiver input and signal ground.

It is impractical to construct a series resonant filter for which the resonant frequency can be controlled to span both the FM and AM bands. Thus, when a series filter is used for an FM receiver in the prior art, signals in the AM frequency range are blocked by the series capacitor of the resonant circuit. Thus, a separate signal path would be required from the antenna to the receiver input for providing AM signals to the radio. However, most AM/FM automotive radio receivers comprise a single AM/FM antenna connected to a single receiver input using a single cable (i.e., there is only a single signal path) to reduce manufacturing complexity and cost.

SUMMARY OF THE INVENTION

It is a principal object of the present invention to provide an RF filter having a series resonant circuit operable as a bandpass filter in the FM frequency range and which transmits signals in the AM frequency range substantially without attenuation.

It is a further object of the present invention to provide an AM/FM radio receiver having input filtering of FM signals and having a single signal path for both AM and FM signals connecting the receiving antenna with the input of the receiver.

It is another object of the present invention to provide apparatus which acts as a variable bandpass filter at FM frequencies and which acts as a low impedance at AM frequencies.

These and other objects are achieved using a bandpass filter having a resonant circuit connected in a single signal path between an AM/FM radio receiver and an AM/FM antenna. The resonant circuit includes a variable inductance connected in series with a capacitance. A bypass inductor is coupled in parallel with the capacitance for bypassing AM signals in the signal path around the capacitance. The bypass inductor is a fixed inductor having a self-resonant frequency located between the AM and FM bands.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

DETAILED DESCRIPTION OF PREFERRED EMBODIMENTS

Figure 2:
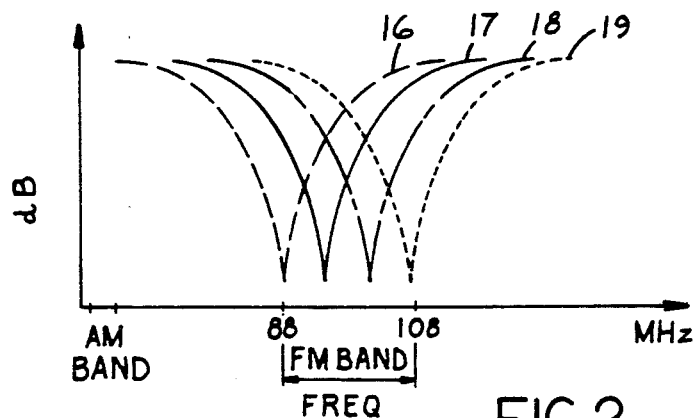
FIG. 2 shows a plot of attenuation versus frequency for a bandpass filter in accordance with FIG. 1.

A basic radio system according to the prior art includes an antenna 10 connected to a bandpass filter 11 and an FM receiver 12. Filter 11 includes a series resonant circuit having a variable inductor 13 in series with a capacitor 14. A control line 15 carries a control signal from FM receiver 12 to variable inductor 13 to shift the resonant frequency of the series resonant circuit (i.e., the center frequency of the passband) in accordance with the tuning voltage developed in the receiver for controlling the mixing oscillator (not shown). Thus, bandpass filter 11 may exhibit a variable attenuation versus frequency curve as shown in FIG. 2. A resonant characteristic curve 16 is exhibited by the filter at a first value of the tuning control signal whereby the center of the passband coincides with the RF signal of interest which is desired to be mixed to the IF frequency of the receiver. When other signals are tuned-in, other values of the tuning control signal shift the resonant characteristic as shown at curves 17-19.

Figure 1:
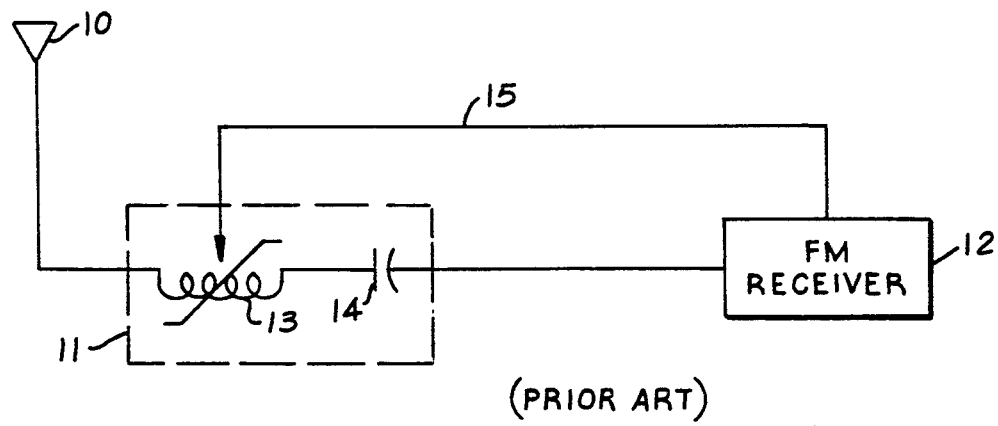
FIG. 1 is a schematic diagram illustrating a bandpass filter according to the prior art.

As shown by all the characteristic curves, however, a large amount of attenuation is provided in the AM frequency band by the series resonant circuit. Since it is not practical to construct resonant circuits wherein the resonant frequency is variable over a wide enough range to include the AM and FM frequency band, the prior art receiver shown in FIG. 1 prevents AM signals received by the antenna from reaching the receiver. Therefore, AM signals cannot be received in receiver 12 unless a separate signal path is provided for AM signals.

Figure 3:
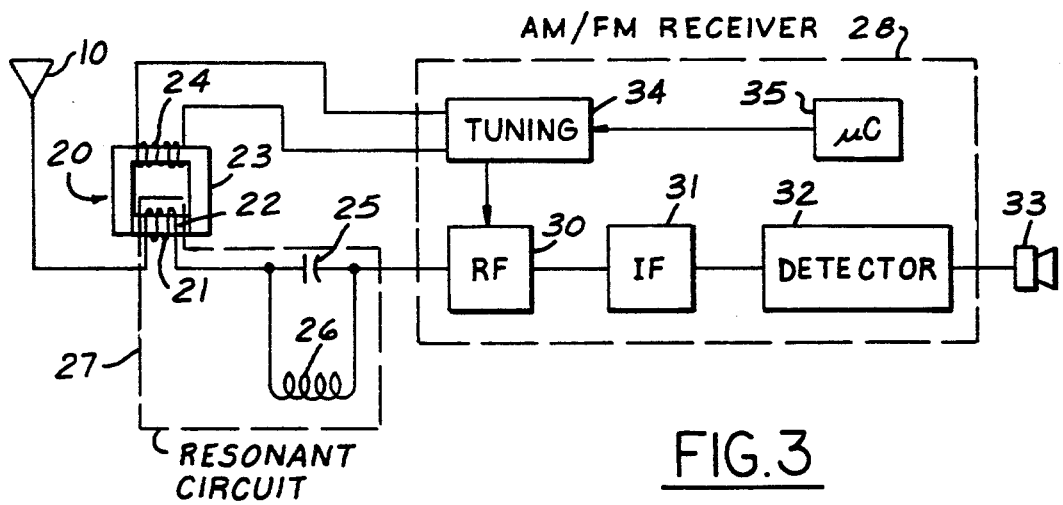
FIG. 3 is a schematic diagram showing a preferred embodiment of the present invention.

The present invention for providing a series resonant filter for FM signals and for allowing the transmission of AM signals through a single signal path is shown in FIG. 3. Antenna 10 is connected to a variable inductor 20 having an inductor winding 21 wound on a first magnetic core segment 22. A core segment 23 having a higher permeability than segment 22 forms a closed magnetic circuit with core segment 22. A magnetizing winding 24 is wound on core segment 23 and controls the inductance of inductor winding 21 by virtue of the current carried by winding 24.

The parallel combination of a capacitor 25 and an inductor 26 is connected in series with inductor 21 thus forming a resonant circuit 27 which is connected to an RF input block 30 in an AM/FM receiver 28. A superheterodyne receiver is shown wherein RF signals in RF block 30 are mixed to an intermediate frequency and provided to an IF block 31 and a detector 32. Detector 32 is connected to an output transducer 33.

A microcontroller 35 for controlling receiver operation is connected to a tuning circuit 34. Tuning circuit 34 provides a mixing signal to RF input block 30 and a filter control signal to magnetizing winding 24.

In operation, series resonant circuit 27 is adapted to have a variable resonant frequency controllable throughout the FM band. Microcontroller 35 receives an operator input (not shown) for commanding a frequency to be received. A digital frequency command is provided by microcontroller 35 to tuning ciruit 34 which converts the command to analog signals for controlling the frequency of a mixing signal and the resonant frequency of resonant circuit 27 in a conventional manner. Thus, the input RF signals of interest are centered in the passband of the resonant filter.

Figure 4:
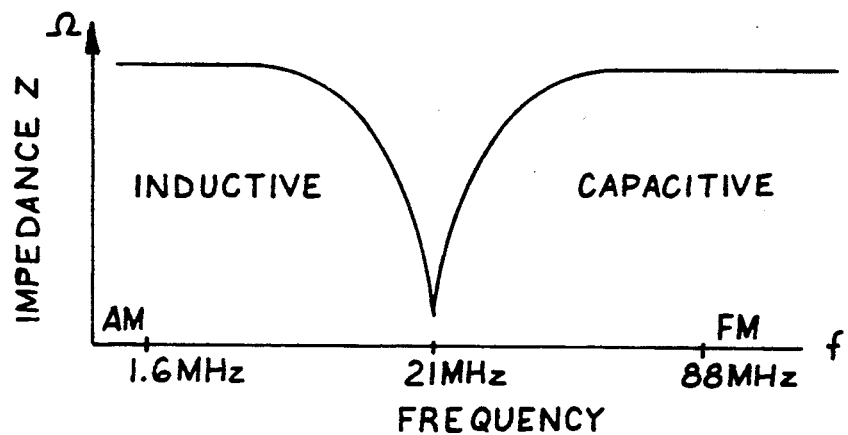
FIG. 4 shows a plot of impedance versus frequency for a preferred bypass inductor according to the invention of FIG. 3.

In order to avoid blocking of AM signals by the series resonant circuit, inductor 26 is provided for bypassing capacitor 25 as shown. Bypass inductor 26 has a characteristic as shown in FIG. 4, wherein the self-resonant frequency of the bypass inductor is located intermediate of the AM and the FM bands and may have a preferred frequency of about 21 megahertz. Thus, the impedance of the bypass inductor is a capacitive impedance in the FM frequency range and is an inductive impedance in the AM frequency range.

Figure 5:
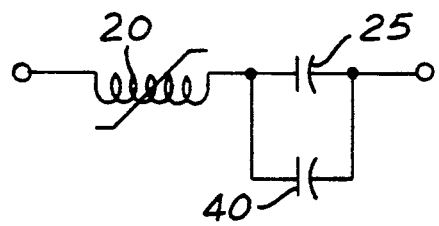
FIG. 5 shows an equivalent circuit of the bandpass filter operating in the FM frequency band.

The resulting equivalent circuit at FM frequencies is shown in FIG. 5, wherein the series resonant circuit behaves as though a capacitor 40 were connected in parallel with capacitor 25 since bypass inductor 26 has a capacitive impedance at FM frequencies. Thus, the series resonant character of the circuit is maintained. Since the effective capacitance of bypass inductor 26 is substantially constant across the FM band (typically about 3 picofarads), the capacitance value of capacitor 25 can be reduced to compensate for the added capacitance of bypass inductor 26.

Figure 6:
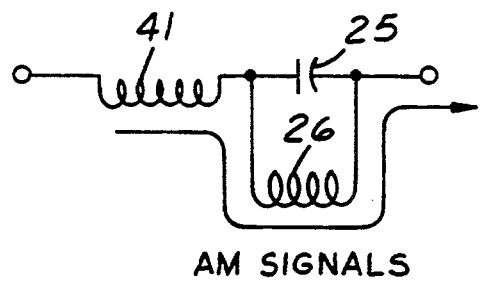
FIG. 6 shows an equivalent circuit of the bandpass filter operating in the AM frequency band.

The equivalent circuit seen by AM signals is shown in FIG. 6, including an equivalent inductor 41 corresponding to variable inductor 20. Both bypass inductor 26 and equivalent inductor 41 have a small inductive impedance at AM frequencies. Thus, AM signals bypass the blocking capacitance of capacitor 25 and reach the receiver using a single signal path having a low impedance.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. Apparatus for connecting an AM/FM radio receiver to an AM/FM antenna using a single signal path, said apparatus comprising:
   resonant circuit means connected in said signal path for providing bandpass filtering of FM signals in said signal path in response to a control signal, said resonant circuit means including a first inductance and a capacitance connected in series in said signal path;
   bypass inductance means coupled in parallel with said capacitance for bypassing AM signals in said signal path around said capacitance; and
   control means coupled to said resonant circuit means for generating said control signal to control the center frequency of said bandpass filtering.

2. The apparatus of claim 1 wherein said bypass inductance means is comprised of a fixed inductor having a self-resonant frequency located between the AM and FM bands.

3. The apparatus of claim 1 wherein said bypass inductance means is comprised of a fixed inductor having a self-resonant frequency of about 21 megahertz.

4. The apparatus of claim 1 wherein said first inductance is comprised of a variable inductor having a core which is magnetized by said control signal.

5. The apparatus of claim 4 wherein said variable inductor includes a main winding for connecting to said signal path and a magnetizing winding for receiving said control signal.

6. A radio receiver comprising:
   an antenna for receiving AM and FM radio frequency transmissions and producing an antenna signal;
   variable bandpass filtering means coupled to said antenna for bandpass filtering said antenna signal in response to a control signal; and
   tuning means coupled to said variable bandpass filtering means for tuning said receiver to a desired RF signal and for generating said control signal in accordance with the frequency of said desired RF signal;
   wherein said variable bandpass filtering means includes a single signal path and is comprised of:
   resonant circuit means connected in said signal path for providing bandpass filtering of FM signals in said signal path in response to said control signal, said resonant circuit means including a first inductance and a capacitance connected in series in said signal path; and
   bypass inductance means coupled in parallel with said capacitance for bypassing AM signals in said signal path around said capacitance.

7. The receiver of claim 6 wherein said bypass inductance means is comprised of a fixed inductor having a self-resonant frequency located between the AM and FM bands.

8. The receiver of claim 6 wherein said bypass inductance means is comprised of a fixed inductor having a self-resonant frequency of about 21 megahertz.

9. The receiver of claim 6 wherein said first inductance is comprised of a variable inductor having a core which is magnetized by said control signal 10. The receiver of claim 9 wherein said variable inductor includes a main winding for connecting to said signal path and a magnetizing winding for receiving said control signal.

11. A method of coupling AM and FM signals from an antenna to a radio using a single signal path, said method comprising the steps of:

providing a series resonant circuit having a capacitive element in said single signal path between said antenna and said radio;

filtering FM signals passing through said series resonant circuit when receiving an FM signal; and bypassing AM signals around said capacitive element of said series resonant circuit through a bypass inductor in parallel with the capacitive element, said bypass inductor having a self-resonant frequency located between the AM and FM bands whereby said inductor provides a capacitive impedance at frequencies in the FM band and an inductive impedance at frequencies in the AM band.

* * * * *